US008779795B2

(12) United States Patent
Takahashi

(10) Patent No.: US 8,779,795 B2
(45) Date of Patent: Jul. 15, 2014

(54) SEMICONDUCTOR CHIP

(75) Inventor: Yuta Takahashi, Hyogo (JP)

(73) Assignee: Renesas Elecronics Corporation, Kanagawa (JP)

( * ) Notice: Subject to any disclaimer, the term of this patent is extended or adjusted under 35 U.S.C. 154(b) by 164 days.

(21) Appl. No.: 13/556,550

(22) Filed: Jul. 24, 2012

(65) Prior Publication Data

US 2013/0062605 A1  Mar. 14, 2013

(30) Foreign Application Priority Data

Sep. 12, 2011 (JP) ................................. 2011-198183

(51) Int. Cl.
*G01R 31/02* (2006.01)
(52) U.S. Cl.
USPC ............ 324/762.02; 324/757.04; 324/757.05; 324/762.04; 324/750.3; 257/E21.499; 257/E21.5; 257/E23.061; 257/686; 257/685; 438/15; 438/25; 438/26
(58) Field of Classification Search
USPC ............ 324/762.01, 762.02, 757.04, 757.05, 324/762.04, 762.06, 750.3, 756.02; 257/E21.499, E21.5, E23.061, 686, 257/685, 777; 438/15, 25, 26
See application file for complete search history.

(56) References Cited

U.S. PATENT DOCUMENTS

| | | | | |
|---|---|---|---|---|
| 6,255,729 B1 * | 7/2001 | Oikawa | ........................ | 257/723 |
| 6,424,035 B1 * | 7/2002 | Sapp et al. | .................... | 257/723 |
| 6,504,252 B2 | 1/2003 | Matsunaga | | |
| 6,670,712 B2 | 12/2003 | Matsunaga | | |
| 6,732,304 B1 * | 5/2004 | Ong | ............................. | 714/718 |
| 6,838,754 B2 * | 1/2005 | Kim | ............................. | 257/666 |
| 7,843,206 B2 * | 11/2010 | Hyobu | ....................... | 324/750.3 |
| 2002/0079584 A1 * | 6/2002 | Matsunaga | ................... | 257/758 |
| 2003/0201523 A1 * | 10/2003 | Akiyama et al. | .............. | 257/685 |
| 2004/0051552 A1 * | 3/2004 | Beppu | .......................... | 324/765 |
| 2004/0150089 A1 * | 8/2004 | Inoue et al. | ................... | 257/685 |
| 2004/0232539 A1 * | 11/2004 | Uchida et al. | ................. | 257/686 |
| 2008/0283986 A1 * | 11/2008 | Hirata | .......................... | 257/678 |
| 2009/0224794 A1 * | 9/2009 | Hyobu | ......................... | 324/765 |

FOREIGN PATENT DOCUMENTS

JP  2002-198491 A  7/2002

* cited by examiner

*Primary Examiner* — Tung X Nguyen
*Assistant Examiner* — Thang Le
(74) *Attorney, Agent, or Firm* — Foley & Lardner LLP

(57) ABSTRACT

In a case where a semiconductor chip is mounted over a first package, 80 pads are coupled to 80 terminals of the package, and in a case where the semiconductor chip is mounted over a second package, 100 pads are coupled to 100 terminals of the second package. An internal circuit of the semiconductor chip operates as a microcomputer with 80 terminals in a case where electrodes are insulated from each other and operates as a microcomputer with 100 terminals in a case where the electrodes are shorted therebetween by an end part of a bonding wire. Therefore, a dedicated pad for setting the number of terminals of the packages is no longer required.

5 Claims, 8 Drawing Sheets

US 8,779,795 B2

SEMICONDUCTOR CHIP

CROSS-REFERENCE TO RELATED APPLICATIONS

The disclosure of Japanese Patent Application No. 2011-198183 filed on Sep. 12, 2011 including the specification, drawings, and abstract is incorporated herein by reference in its entirety.

BACKGROUND

The present invention relates to a semiconductor chip, and more specifically to a semiconductor chip mountable over a desired one of two packages with mutually different numbers of terminals.

Conventionally, there is a semiconductor chip mountable over a desired one of a first package having N-number (N is a natural number) of terminals and a second package having M-number (M is an integer larger than N) of terminals. This semiconductor chip is provided with: a dedicated pad for setting the number of terminals of the package mounted with the semiconductor chip; and M-number of pads.

In a case where the semiconductor chip is mounted over the first package, the dedicated pad and a power supply pad receiving supply voltage are coupled to each other by a bonding wire. Moreover, N-number of pads of the M-number of pads of the semiconductor chip are respectively coupled to N-number of terminals of the first package by N-number of bonding wires. An internal circuit of the semiconductor chip operates as a first semiconductor device having N-number of terminals in response to provision of the supply voltage to the dedicated pad.

Moreover, in a case where the semiconductor chip is mounted over the second package, the dedicated pad and a grounding pad receiving grounding voltage are coupled to each other by a bonding wire. Moreover, the M-number of pads of the semiconductor chip are respectively coupled to M-number of terminals of the second package by M-number of bonding wires. The internal circuit of the semiconductor chip operates as a second semiconductor device having the M-number of terminals in response to provision of the grounding voltage to the dedicated pad.

Japanese Unexamined Patent Publication No. 2002-198491 discloses a technology of dividing a pad into a plurality of electrodes for reducing adverse effect exerted on a transistor by plasma via the pad in semiconductor chip manufacturing processes.

SUMMARY

However, the conventional semiconductor chip has faced a problem that a chip area increases by an amount corresponding to the dedicated pad. Moreover, the bonding wire coupling the dedicated pad and the power supply pad (or the grounding pad) to each other is required, resulting in a cost increase. Moreover, in case of an error in the bonding between the dedicated pad and the power supply pad (or grounding pad), erroneous operation of the internal circuit occurs.

Thus, it is a main object of the invention to provide a semiconductor chip that has a small chip area, is low in cost, and hardly causes erroneous operation.

A semiconductor chip according to one aspect of the present invention physically divides a pad used as an input and output terminal of the semiconductor chip, and determines the number of terminals effectively used as the semiconductor chip in accordance with whether or not the divided pads are shorted therebetween by wire bonding.

With a semiconductor chip according to the present invention, the effective number of terminals can be determined in accordance with whether or not divided pads are shorted therebetween by bonding, thus no longer requiring a pad dedicated for setting the effective number of terminals.

DETAILED DESCRIPTION

First, the schematic configuration of a semiconductor chip according to the present invention and its effect will be described. The semiconductor chip according to the invention is a semiconductor chip mountable over a desired one of a first package having N-number (N is a natural number) of first terminals and a second package having M-number (M is an integer larger than N) of second terminals, and includes N-number of first pads and (M−N)-number of second pads. In a case where the semiconductor chip is mounted over the first package, the N-number of first pads are respectively coupled to the N-number of first terminals via N-number of bonding wires. In a case where the semiconductor chip is mounted over the second package, the N-number of first pads and the (M−N)-number of second pads are respectively coupled to the M-number of second terminals via M-number of bonding wires. A selected one of the (M−N)-number of second pads is divided into first and second electrodes insulated from each other. The first and second electrodes are arranged at a predetermined interval therebetween, and when a corresponding second pad is coupled to the corresponding second terminal via the bonding wire, short by an end part of the bonding wire occurs. This semiconductor chip further includes an internal circuit operating as a first semiconductor device having the N-number of first terminals in a case where the first and second electrodes are insulated from each other and operating as a second semiconductor device having the M-number of second terminals in a case where the first and second electrodes are shorted therebetween.

In the semiconductor chip according to the invention, in a case where the selected one of the (M−N)-number of second pads is divided into the first and second electrodes and the first and second electrodes are insulated from each other, the internal circuit operates as the first semiconductor device having the N-number of first terminals, and in a case where the first and second electrodes are shorted therebetween, the internal circuit operates as the second semiconductor device having the M-number of second terminals. Therefore, a dedicated pad for setting the number of terminals of the package is no longer required, thus permitting realization of a semiconductor chip that has a small chip area, is low in cost, and hardly causes erroneous operation. Hereinafter, the semiconductor chip according to the invention will be described in detail with reference to the drawings.

First Embodiment

Figure 1A:
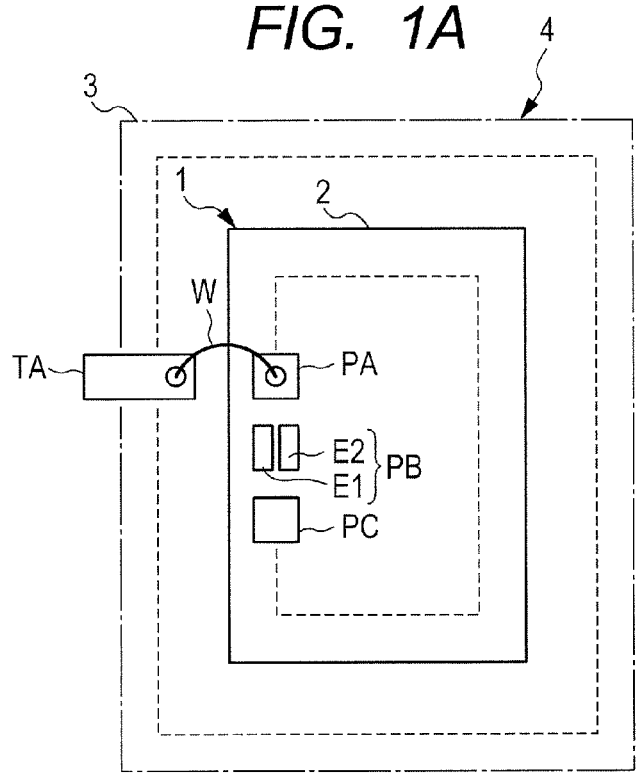
FIGS. 1A and 1B are diagrams showing the configuration of a semiconductor chip and its usage according to a first embodiment of the present invention.
Figure 1B:
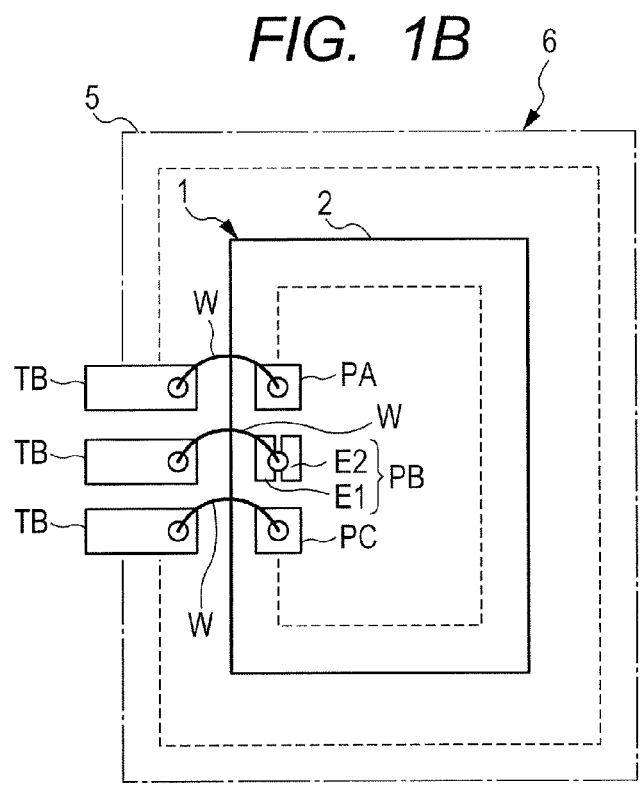

The semiconductor chip 1 according to the first embodiment of the invention, as shown in FIGS. 1A and 1B, includes: a semiconductor substrate 2 of a rectangular shape; 80 pads PAD; one pad PB; and 19 pads PC. The pads PA, PB, and PC are arrayed along the outer periphery of a surface of the semiconductor substrate 2. The pad PB includes two electrodes E1 and E2 arranged at a predetermined interval therebetween. The interval between the electrodes E1 and E2 is set to be smaller than a diameter of an end part of a bonding wire W. Moreover, the interval between the electrodes E1 and E2 is set at a distance that permits electrical insulation between the electrodes E1 and E2.

The semiconductor chip 1 is mountable over a desired one of a package 3 with 80 terminals (80 pins) and a package 5 with 100 terminals (100 pins). The package 3, as shown in FIG. 1A, includes 80 terminals TA. The 80 terminals TA are arrayed along the outer periphery of the rectangular package. In a case where the semiconductor chip 1 is mounted over the package 3, the 80 pads PA are respectively coupled to the 80 terminals TA via 80 bonding wires W.

In this case, the bonding wire W is not coupled to the pad PB, and thus the two electrodes E1 and E2 included in the pad PB are not shorted therebetween. The internal circuit of the semiconductor chip 1, based on the fact that the electrodes E1 and E2 are not shorted therebetween, judges that it is mounted over the package 3 with the 80 terminals, and operates as a microcomputer (semiconductor device) with the 80 terminals. Therefore, the semiconductor chip 1 and the package 3 form a microcomputer 4 with the 80 terminals.

Moreover, the package 5, as shown in FIG. 1B, includes 100 terminals TB. The 100 terminals TB are arrayed along the outer periphery of the rectangular package. In a case where the semiconductor chip 1 is mounted over the package 5, a total of the 100 pads PA, PB, and PC are respectively coupled to the 100 terminals TB via 100 bonding wires W.

In this case, one end part of the bonding wire W is bonded to the pad PB, and the two electrodes E1 and E2 included in the pad PB are shorted therebetween by one end part of the bonding wire W. The internal circuit of the semiconductor chip 1, based on the fact that the electrodes E1 and E2 are shorted therebetween, judges that the semiconductor chip 1 is mounted over the package 5 with the 100 terminals, and operates as a microcomputer with the 100 terminals. Therefore, the semiconductor chip 1 and the package 5 form a microcomputer 6 with the 100 terminals.

Figure 2:
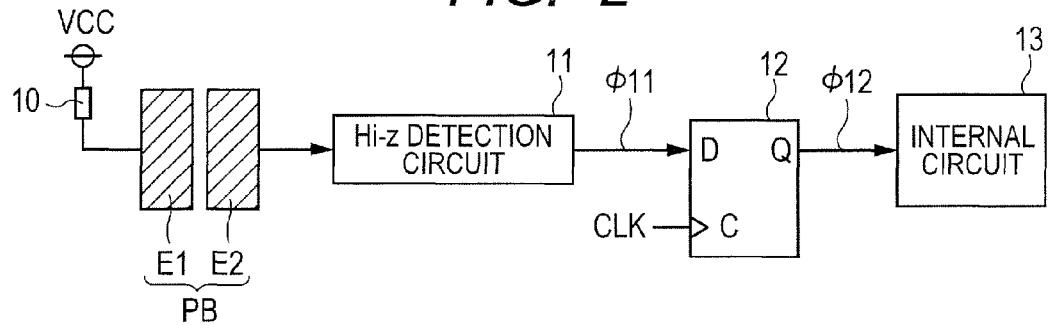
FIG. 2 is a circuit block diagram showing major parts of the semiconductor chip shown in FIG. 1.

FIG. 2 is a circuit block diagram showing major parts of the semiconductor chip 1. In FIG. 2, the semiconductor chip 1 includes: a resistive element 10 provided in correspondence with the pad PB; Hi-z (high-impedance) detection circuits 11; a register 12, and an internal circuit 13. One electrode of the resistive element 10 receives supply voltage VCC and the other electrode thereof is coupled to the electrode E1 of the pad PB.

Figure 3:
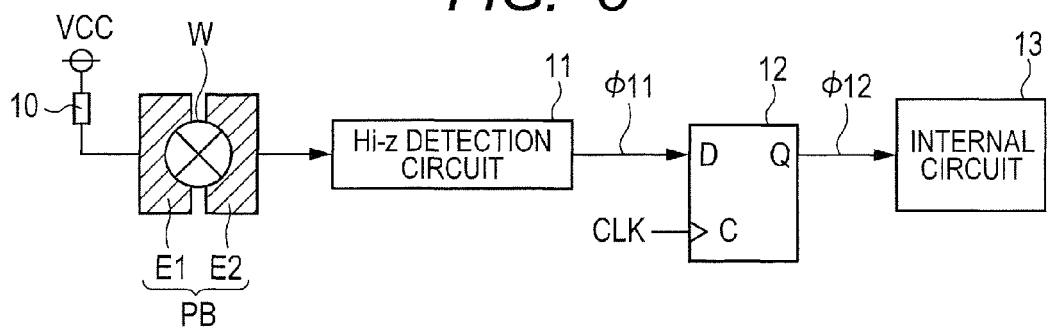
FIG. 3 is a circuit block diagram showing a state in which two electrodes shown in FIG. 2 are shorted therebetween by a bonding wire.

In a case where the bonding wire W is not coupled to the pad PB, the electrodes E1 and E2 are insulated from each other, and the electrode E2 turns into a Hi-z state. As shown in FIG. 3, in a case where the bonding wire W is coupled to the pad PB, the electrodes E1 and E2 are shorted therebetween by an end part of the bonding wire W. In this case, the supply voltage VCC is given to the electrode E2 via the electrode E1 and the end part of the bonding wire W.

The electrode E2 of the pad PB is coupled to the Hi-z detection circuit 11. The Hi-z detection circuit 11 detects whether or not the supply voltage VCC has been supplied to the electrode E2, and in a case where the supply voltage VCC has not been supplied to the electrode E2, turns a signal $\phi 11$ to an "H"-level, and in a case where the supply voltage VCC has been supplied to the electrode E2, turns the signal $\phi 11$ to an "L"-level.

In other words, the Hi-z detection circuit 11 detects whether or not the electrode E2 is in the Hi-z state, turns the signal $\phi 11$ to an "H"-level in a case where the electrode E2 is in the Hi-z state and turns the signal $\phi 11$ to an "L"-level in a case where the electrode E2 is not in the Hi-z state.

Further in other words, the Hi-z detection circuit 11 detects whether the electrodes E1 and E2 are insulated from each other or are shorted therebetween, and turns the signal $\phi 11$ to an "H"-level in a case where the electrodes E1 and E2 are insulated from each other and turns the signal $\phi 11$ to an "L"-level in a case where the electrodes E1 and E2 are shorted therebetween.

The register 12, in response to a rising edge of a clock signal CLK, holds and outputs the output signal $\phi 11$ of the Hi-z detection circuit 11. An output signal $\phi 12$ of the register 12 is given to the internal circuit 13.

In a case where the signal $\phi 12$ is at an "H"-level, the internal circuit 13 judges that the semiconductor chip 1 is mounted over the package 3 with the 80 terminals, and operates as the microcomputer with the 80 terminals. In this case, the semiconductor chip 1 and the package 3 form the microcomputer 4 with the 80 terminals.

Moreover, if the signal $\phi 12$ is at an "L"-level, the internal circuit 13 judges that the semiconductor chip 1 is mounted over the package 5 with the 100 terminals, and operates as the microcomputer with the 100 terminals. In this case, the semiconductor chip 1 and the package 5 form the microcomputer 6 with the 100 terminals.

Figure 4:
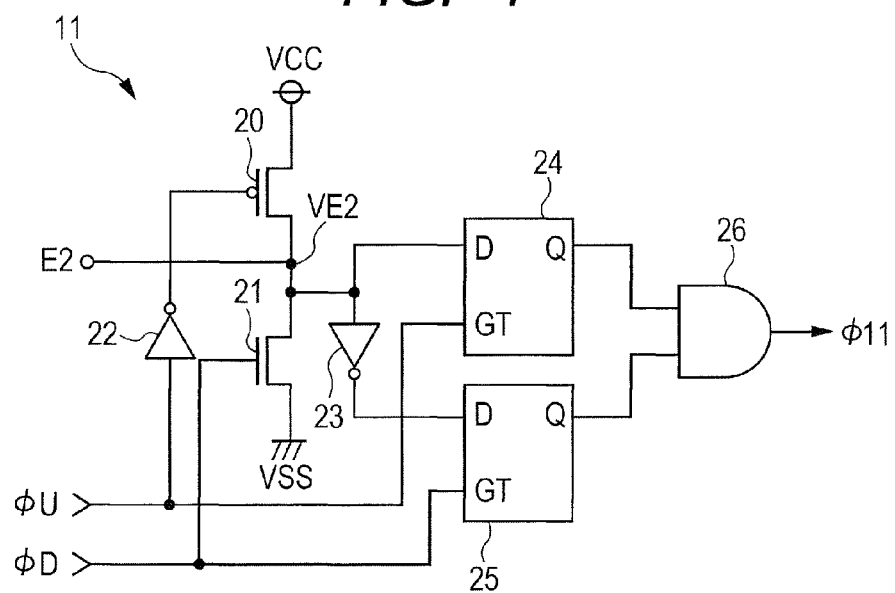
FIG. 4 is a circuit block diagram showing the configuration of a Hi-z detection circuit shown in FIG. 2.
Figure 5:
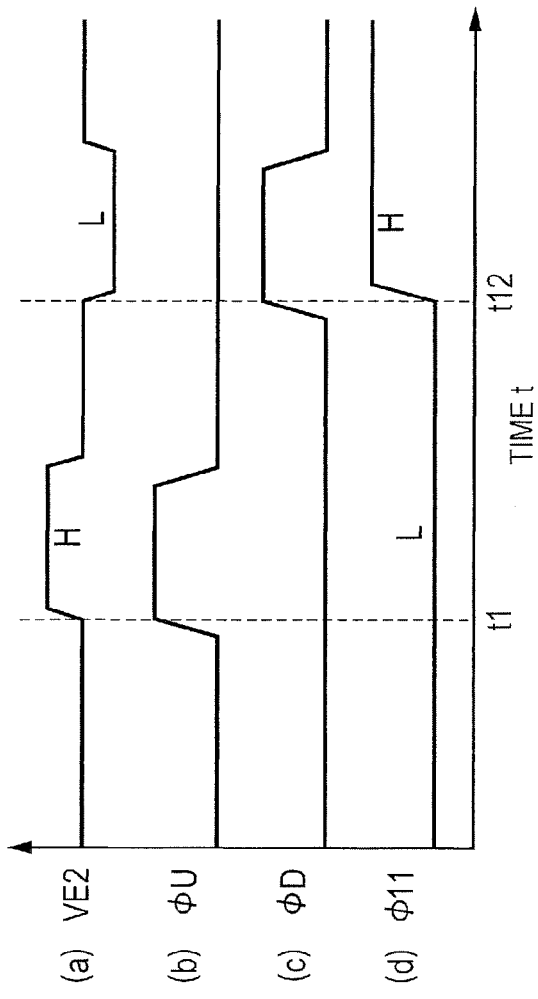
FIG. 5 is a time chart showing operation of the Hi-z detection circuit shown in FIG. 4.
Figure 6:
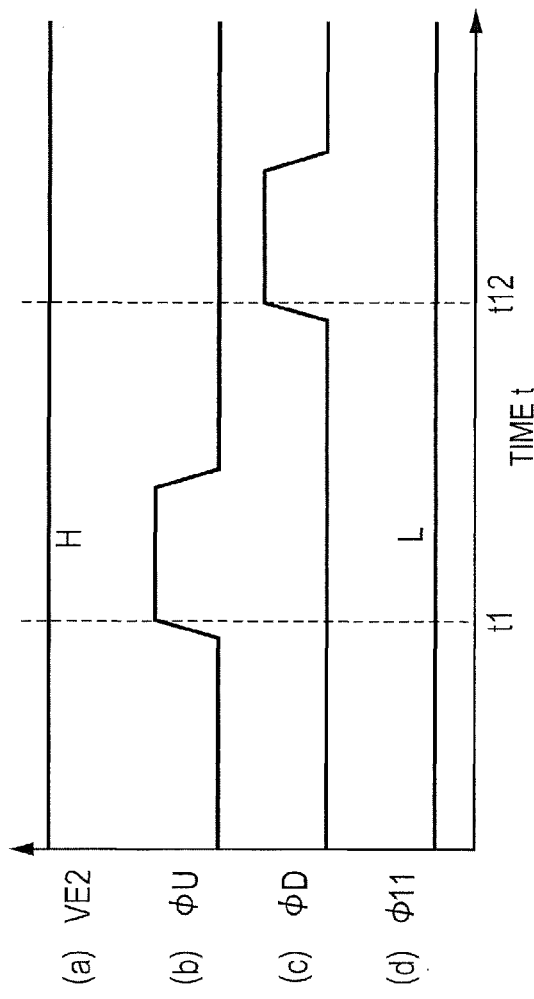
FIG. 6 is another time chart showing the operation of the Hi-z detection circuit shown in FIG. 4.

FIG. 4 is a circuit block diagram showing configuration of the Hi-z detection circuit 11. In FIG. 4, the Hi-z detection circuit 11 includes: a P-channel MOS transistor 20, an N-channel MOS transistor 21, inverters 22 and 23, latch circuits 24 and 25, and an AND gate 26. The P-channel MOS transistor 20 and the N-channel MOS transistor 21 are coupled in series between a line of the supply voltage VCC and a line of grounding voltage VSS. Drains of the P-channel MOS transistor 20 and the N-channel MOS transistor 21 are coupled to the electrode E2 of the pad PB.

A pull-up signal $\phi U$ is inverted by the inverter 22 and given to a gate of the P-channel MOS transistor 20, and is also given directly to a control terminal of the latch circuit 24. A pull-down signal $\phi D$ is given to a gate of the N-channel MOS transistor 21 and a control terminal of the gas latch circuit 25. A signal VE2 appearing at the drains of the P-channel MOS transistor 20 and the N-channel MOS transistor 21 is given to an input terminal of the latch circuit 24 and also inverted by the inverter 23 and given to an input terminal of the latch circuit 25. The AND gate 26 receives output signals of the latch circuits 24 and 25 and outputs a signal of their logical sum. An output signal of the AND gate 26 serves as the output signal φ11 of the Hi-z detection circuit 11.

FIG. 5(a) to (d) is a time chart showing operation of the Hi-z detection circuit 11 in a case where the electrode E2 is in the Hi-z state (in a case where the electrodes E1 and E2 are insulated from each other). In FIG. 5(a) to (d), the signals φU, φD, and φ11 are all at "L"-levels in an initial state. Thus, both the P-channel MOS transistor 20 and the N-channel MOS transistor 21 are in a non-conducting state.

At given time t1, the pull-up signal φU is raised from the "L"-level to an "H"-level, the P-channel MOS transistor 20 is conducted and the signal VE2 is turned to an "H"-level (supply voltage VCC). Moreover, the latch circuit 24, in response to a rising edge of the pull-up signal φU, holds and outputs the signal VE2 at the "H"-level.

After the pull-up signal φU is dropped to an "L"-level, at time t2, the pull-down signal φD is raised from the "L"-level to an "H"-level, upon which the N-channel MOS transistor 21 is conducted and the signal VE2 is turned to an "L"-level (grounding voltage VSS). The signal VE2 is inverted by the inverter 23 and given to the latch circuit 25. Moreover, the latch circuit 25, in response to a rising edge of the pull-down signal φD, holds and outputs the inverted signal of the signal VE2, that is, an "H"-level signal. Since both the output signals of the latch circuits 24 and 25 turned to the "H"-levels, the output signal φ11 of the AND gate 26 turns to an "H"-level.

Moreover, FIG. 6(a) to (d) is a timing chart showing operation of the Hi-z detection circuit 11 in a case where the electrode E2 is not in the Hi-z state (in a case where the electrodes E1 and E2 are shorted therebetween). In FIG. 6(a) to (d), the supply voltage VCC is given to the electrodes E1 and E2, and thus the signal VE2 is fixed at an "H"-level. Moreover, the signals φU, φD, and φ11 are all at "L"-levels in an initial state. Thus, both the P-channel MOS transistor 20 and the N-channel MOS transistor 21 are in a non-conducting state.

At given time t1, the pull-up signal φU is raised from the "L"-level to an "H"-level, upon which the P-channel MOS transistor 20 is conducted. In this case, regardless of whether or not the P-channel MOS transistor 20 is conducted, the signal VE2 is fixed at the "H"-level. Moreover, the latch circuit 24, in response to a rising edge of the pull-up signal φU, holds and outputs the signal VE2 at the "H"-level.

After the pull-up signal φU is dropped to an "L"-level, at time t2, the pull-down signal φD is raised from the "L"-level to an "H"-level, upon which the N-channel MOS transistor 21 is conducted. In this case, a resistance value of the resistive element 10 is set sufficiently smaller than a value of conducting resistance of the N-channel MOS transistor 21, and thus even when the N-channel MOS transistor 21 is conducted, the signal VE2 remains at the "H"-level without any change.

The signal VE2 is inverted by the inverter 23 and given to the latch circuit 25. Moreover, the latch circuit 25, in response to a rising edge of the pull-down signal φD, holds and outputs the inverted signal of the signal VE2, that is, an "L"-level signal. The output signals of the latch circuits 24 and 25 turned to the "H"-level and the "L"-level, respectively, and thus the output signal φ11 of the AND gate 26 turns to an "L"-level.

Figure 7:
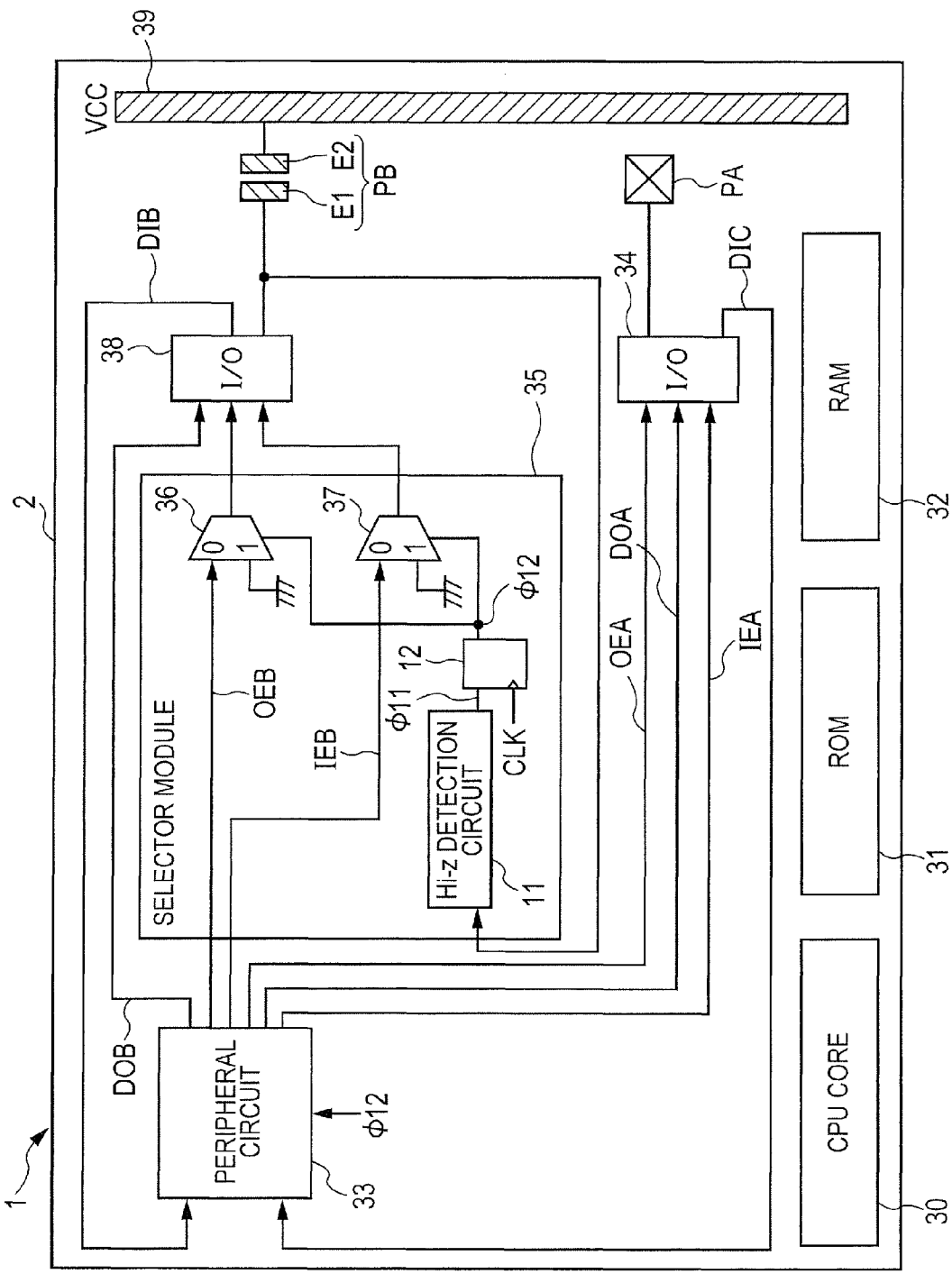
FIG. 7 is a circuit block diagram schematically showing the overall configuration of the semiconductor chip shown in FIG. 1.

FIG. 7 is a circuit block diagram schematically showing overall configuration of the semiconductor chip 1. In FIG. 7, the semiconductor chip 1 includes the semiconductor substrate 2. Over a surface of the semiconductor substrate 2, there are mounted a CPU (Central Processing Unit) core 30, a ROM (Read Only Memory) 31, a RAM (Random Access Memory) 32, a peripheral circuit 33, data input and output circuits (I/O) 34 and 38, a selector module 35, pads PA and PB, and a power supply wire 39. A pad PC is omitted for simplification of the drawings and the description.

The CPU core 30 executes a program stored in the ROM 31. Moreover, the CPU core 30 receives data from an external device, the ROM 31, and the RAM 32, and performs processing on the data and outputs it to the external device, the ROM 31, and the RAM 32.

In a case where the semiconductor chip 1 is mounted onto the package 3 with the 80 terminals and the output signal φ12 of the register 12 is turned to an "H" level, the peripheral circuit 33 performs data inputting and outputting by using the data input and output circuit 34 and the pad PA. In a case where inputting of a data signal DIA is permitted, the peripheral circuit 33 turns an input enable signal DOA to an "H" level that is an active level, and in a case where outputting of the input enable signal DOA is permitted, the peripheral circuit 33 turns an output enable signal OEA to an "H" level that is an active level.

Figure 8:
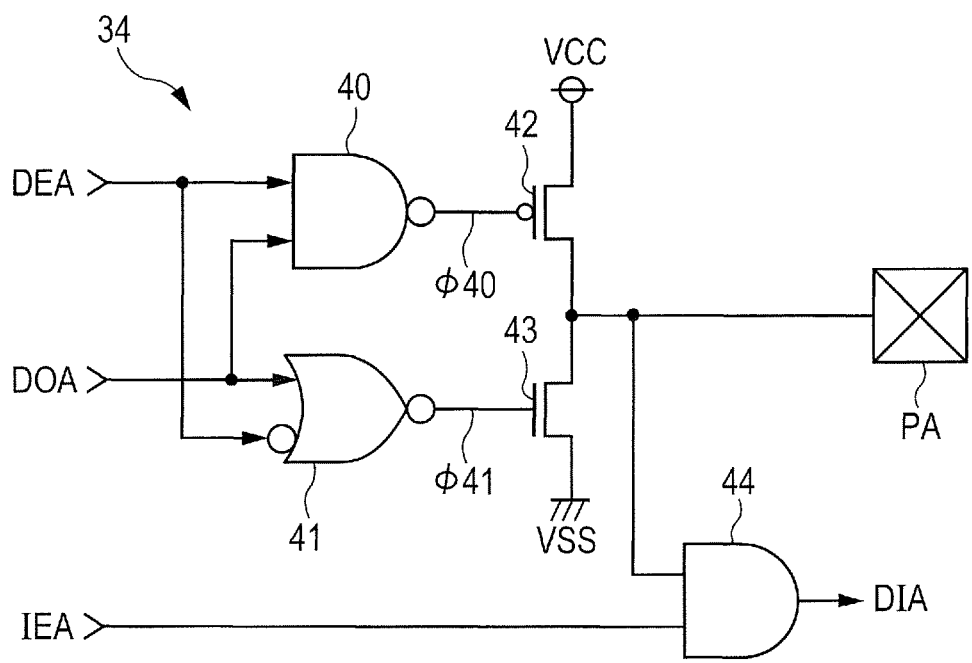
FIG. 8 is a circuit diagram showing the configuration of a data input and output circuit shown in FIG. 7.

The first latch circuit 34, as shown in FIG. 8, includes: a NAND gate 40, a gate circuit 41, a P-channel MOS transistor 42, an N-channel MOS transistor 43, and an AND gate 44. Each of the NAND gate 40 and the gate circuit 41 receives the output enable signal OEA and the input enable signal DOA.

The P-channel MOS transistor 42 is coupled between the line of the supply voltage VCC and the pad PA, and its gate receives an output signal φ40 of the NAND gate 40. The N-channel MOS transistor 43 is coupled between the pad PA and a line of the grounding voltage VSS, and its gate receives an output signal φ41 of the gate circuit 41. One of input nodes of the AND gate is coupled to the pad PA, and the other input node receives the input enable signal IEA and outputs the data signal DIA.

In a case where inputting of the data signal DIA is permitted, the output enable signal OEA is turned to an "L" level that is an inactive level, and the input enable signal IEA is turned to an "H" level that is an active level. When the output enable signal OEA is turned to the "L" level, the signals φ40 and φ41 are fixed at an "H" level and an "L" level, respectively, and both the P-channel MOS transistor 42 and the N-channel MOS transistor 43 are made non-conductive. Moreover, when the signal IEA is turned to the "H" level, the AND gate 44 operates as a buffer, the data signal DIA given from the outside via the pad PA is given to the peripheral circuit 33 via the AND gate 44 and is then given from the peripheral circuit 33 to, for example, the CPU core 30.

In a case where outputting of the input enable signal DOA is permitted, the input enable signal IEA is turned to an "L" level that is an inactive level, and the output enable signal OEA is turned to an "H" level that is an active level. When the input enable signal IEA is turned to the "L" level that is an inactive level, the data signal DIA of the AND gate 44 is fixed at an "L" level. Moreover, when the output enable signal OEA is turned to the "H" level, each of the NAND gate 40 and the gate circuit 41 operates as an inverter, and an inversion signal of the input enable signal DOA is given to gates of the P-channel MOS transistor 42 and the N-channel MOS transistor 43.

In a case where a data signal DO is at an "H" level, the P-channel MOS transistor 42 is conducted, the N-channel MOS transistor 43 is not conducted, and the pad PA is turned to an "H" level. In a case where the data signal DO is at an "L" level, the P-channel MOS transistor 42 is not conducted and the N-channel MOS transistor 43 is conducted, and the pad PA is turned to an "L level. Therefore, the input enable signal DOA is outputted to the pad PA. The data input and output circuit 38 also has the same configuration as that of the data input and output circuit 34.

Returning to FIG. 7, in the case where the semiconductor chip 1 is mounted over the package 3 with the 80 terminals and the output signal φ12 of the register 12 is turned to an "H" level, the peripheral circuit 33 does not use the data input and output circuit 38 and the pads PB.

Moreover, in a case where the semiconductor chip 1 is mounted over the package 5 with the 100 terminals and the output signal φ12 of the register 12 is turned to an "L" level, the peripheral circuit 33 uses, in addition to the data input and output circuit 34 and the pad PA, the data input and output circuit 38 and the pad PB to perform data inputting and outputting. In a case where inputting of a data signal DIB is permitted, the peripheral circuit 33 turns the input enable signal IEB to an "H" level that is an active level, and in a case where outputting of a data signal DOB is permitted, the peripheral circuit 33 turns the output enable signal OEB to an "H" level that is an active level.

The selector module 35 includes: the Hi-z detection circuit 11, the register 12, and selectors 36 and 37. The configuration and operation of the Hi-z detection circuit 11 and the register 12 are as shown in FIGS. 2 to 6. The selector 36 receives the output enable signal OEB and the "L" level (grounding voltage VSS) signal, and is controlled by the output signal φ12 of the register 12. The selector 36, in a case where the output signal φ12 of the register 12 is at an "H" level, gives the "L" level signal instead of the output enable signal OEB to the data input and output circuit 38, and in a case where the output signal φ12 of the register 12 is at an "L" level, gives the output enable signal OEB to the data input and output circuit 38.

The selector 37 receives the input enable signal IEB and the "L" level (grounding voltage VSS) signal, and is controlled by the output signal φ12 of the register 12. The selector 37, in a case where the output signal φ12 of the register 12 is at an "H" level, gives the "L" level signal instead of the input enable signal IEB to the data input and output circuit 38, and in a case where the output signal φ12 of the register 12 is at an "L" level, gives the input enable signal IEB to the data input and output circuit 38.

Therefore, in a case where the output signal φ12 of the register 12 is at an "H" level, the P-channel MOS transistor 42 and the N-channel MOS transistor 43 of the data input and output circuit 38 are fixed in a non-conductive state, an output signal of the AND gate 44 is fixed at an "L" level (see FIG. 8), and data signal inputting and outputting are prohibited. Moreover, in a case where the output signal φ12 of the register 12 is at an "L" level, the output enable signal OEB and the input enable signal IEB pass through the selectors 36 and 37 and are given to the data input and output circuit 38, permitting data signal inputting and outputting.

As described above, in the first embodiment, the pad PB, which is not used in the case where the semiconductor chip 1 is mounted over the package 3 with the 80 terminals and is used in the case where the semiconductor chip 1 is mounted over the package 5 with the 100 terminals, is divided into the two electrodes E1 and E2. Moreover, in a case where the electrode E2 of the pad PB is in the Hi-z state, it is judged that the semiconductor chip 1 is mounted over the package 3 with the 80 terminals, and in a case where the electrode E2 of the pad PB is not in the Hi-z state, it is judged that the semiconductor chip 1 is mounted over the package 5 with the 100 terminals. Therefore, compared to a conventional one which is provided with a dedicated pad for setting the number of terminals of the package mounted with the semiconductor chip and which has the dedicated pad and a power supply pad or a grounding pad coupled by a bonding wire, a chip area is reduced by an amount corresponding to the dedicated pad. Moreover, the bonding wire coupling together the dedicated pad and the power supply pad (or grounding pad) is no longer required, and costs are reduced accordingly. Moreover, occurrence of erroneous operation caused by an error in the bonding between the dedicated pad and the power supply pad (or grounding pad) can be prevented.

Second Embodiment

Figure 9:
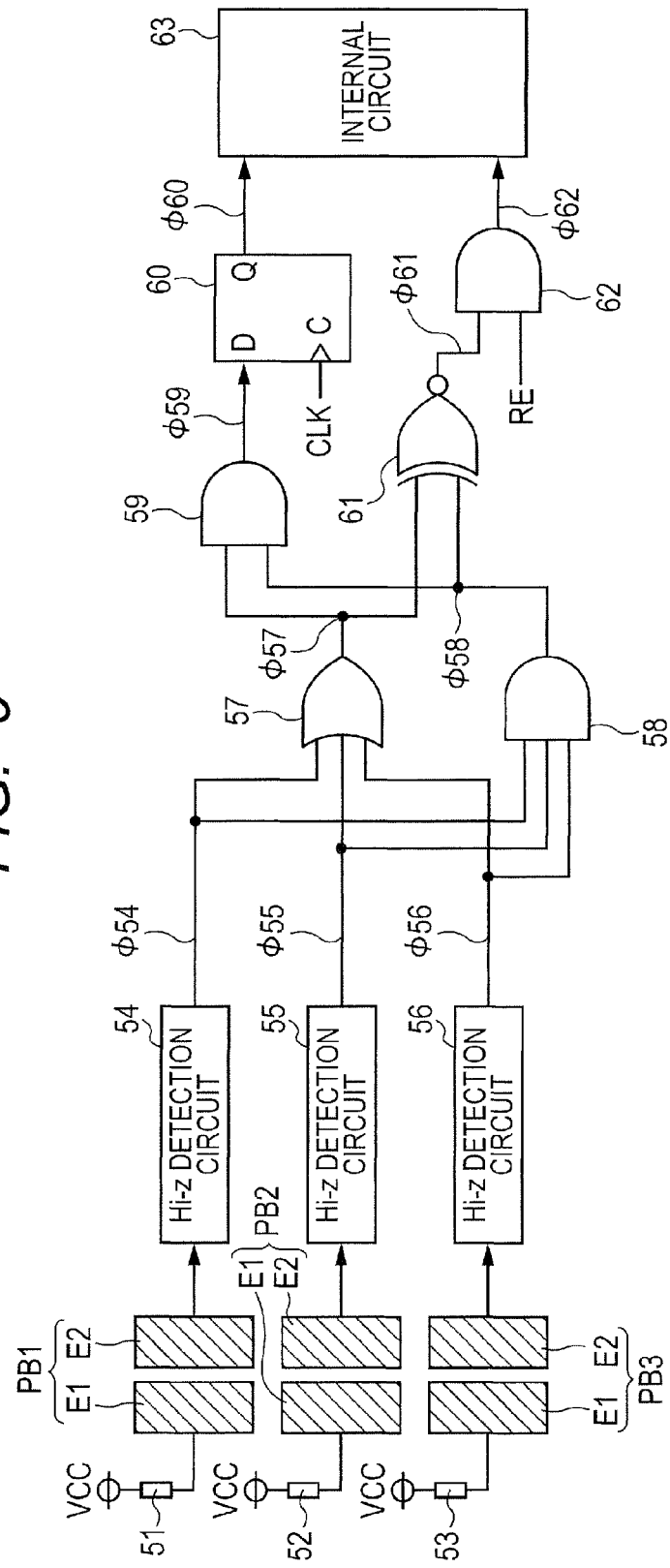
FIG. 9 is a circuit block diagram showing major parts of a semiconductor chip according to a second embodiment of the invention.

FIG. 9 is a circuit block diagram, in comparison to FIG. 2, showing major parts of a semiconductor chip according to the second embodiment of the invention. In the semiconductor chip 1 of the first embodiment, one pad PB of the 20 pads (PC) not used when mounted over the package 3 with the 80 terminals and used when mounted over the package 5 with the 100 terminals is used for determining the number of terminals of the package. On the contrary, in this second embodiment, a plurality of (here, three) pads PB1 to PB3 of the 20 pads (PC) not used when mounted over the package 3 with the 80 terminals and used when mounted over the package 5 with the 100 terminals are used for determining the number of terminals of the package.

Specifically, this semiconductor chip includes: the pads PB1 to PB3, resistive elements 51 to 53, Hi-z detection circuits 54 to 56, an OR gate 57, AND gates 58, 59, and 62, a register 60, an Ex-NOR gate 61, and an internal circuit 63. Each of the pads PB1 to PB3 includes two electrodes E1 and E2 arranged at a predetermined interval therebetween.

Figure 10:
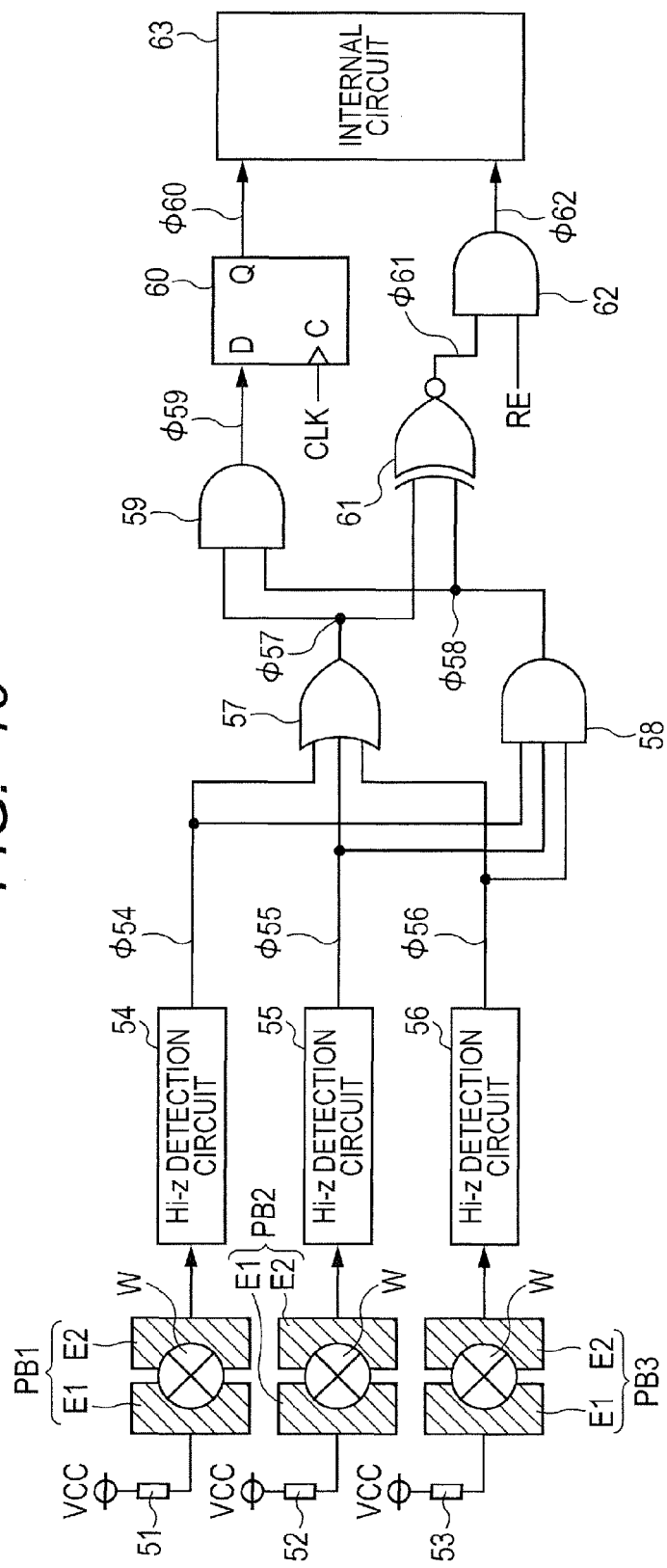
FIG. 10 is a circuit block diagram showing a state in which two electrodes included in each pad shown in FIG. 9 are shorted therebetween by a bonding wire.

One-side electrodes of the resistive elements 51 to 53 receive the supply voltage VCC, and the other-side electrodes thereof are respectively coupled to the electrodes E1 of the pads PB1 to PB3. In a case where the bonding wire W is not coupled to each of the pads PB1 to PB3, the electrodes E1 and E2 are insulated from each other, and the electrodes E2 turn to the Hi-z state. As shown in FIG. 10, in a case where the bonding wire W is coupled to each of the pads PB1 to PB3, the electrodes E1 and E2 are shorted therebetween by an end part of the bonding wire W. In this case, the supply voltage VCC is given to the electrodes E1 and via the end part of the bonding wire W to the electrodes E2.

The electrodes E2 of the pads PB1 to PB3 are respectively coupled to the Hi-z detection circuits 54 to 56. The configuration and operation of each of the Hi-z detection circuits 54 to 56 are the same as those of the Hi-z detection circuit 11. The Hi-z detection circuits 54 to 56 respectively turn signals φ54 to φ56 to "H" levels in a case where the electrodes E2 are in the Hi-z state and turn the signals φ54 to φ56 to "L" levels in a case where the electrodes E2 are not in the Hi-z state.

In other words, the Hi-z detection circuits 54 to 56 detect whether or not the electrodes E1 and E2 are shorted therebetween, respectively turn the signals φ54 to φ56 to the "H" levels in a case where the electrodes E1 and E2 are not shorted therebetween, and turn the signals φ54 to φ56 to the "L" levels in a case where the electrodes E1 and E2 are shorted therebetween.

The OR gate 57 receives the signals φ54 to φ56, and outputs a signal φ57 of their logical sum. The AND gate 58 receives the signals φ54 to φ56, and outputs a signal φ58 of their logical sum. The AND gate 59 receives the signals φ57 and φ58, and outputs a signal φ59 of their logical sum. The register 60, in response to a rising edge of the clock signal CLK, holds and outputs the output signal φ59 of the AND gate 59. An output signal φ60 of the register 60 is given to the internal circuit 63.

The Ex-NOR gate 61 receives the signals φ57 and φ58, turns a signal φ61 to an "H" level in a case where logical levels of the signals φ57 and φ58 agree with each other, and turns the signal φ61 to an "L" level in a case where the logical levels of the signals φ57 and φ58 do not agree with each other. The AND gate 62 outputs a signal φ62 of a logical sum of the signal φ61 and the reset signal RE. The reset signal RE is a signal turned to an "L" level, which is an active level, to reset the internal circuit 63. The signal φ62 is given to the internal circuit 63.

As shown in FIG. 9, in a case where the semiconductor chip is mounted over the package 3 with the 80 terminals and the electrodes E1 and E2 of the pads PB1 to PB3 are not shorted therebetween, the output signals φ54 to φ56 of the Hi-z detection circuits 54 to 56 are all turned to "H" levels, and the signals φ57 to φ62 are all turned to "H" levels. Note that the reset signal RE is fixed at an "H" level. The internal circuit 63, in a case where the signal φ60 is at the "H" level, judges that the semiconductor chip is mounted over the package 3 with the 80 terminals, and operates as a microcomputer by using 80 pads PA. In this case, the semiconductor chip and the package 3 form the microcomputer 4 with the 80 terminals.

Moreover, as shown in FIG. 10, in a case where the semiconductor chip is mounted over the package 5 with the 100 terminals and the electrodes E1 and E2 of the pads PB1 to PB3 are shorted therebetween, the output signals φ54 to φ56 of the Hi-z detection circuits 54 to 56 all turn to "L" levels, the signals φ57 to φ60 all turn to "L" levels, and the signals φ61 and φ62 turn to "H" levels. Note that the reset signal RE is fixed at an "H" level. The internal circuit 63, in a case where the signal φ60 is at the "L" level, judges that the semiconductor chip is mounted over the package 5 with the 100 terminals, and operates as a microcomputer by using the 100 pads PA, PB, and PC. In this case, the semiconductor chip and the package 5 form the microcomputer 6 with the 100 terminals.

Moreover, in FIG. 10, in a case where the electrodes E1 and E2 of the pad PB3 are not shorted therebetween as a result of failure in bonding of one or two (for example, the pad PB3) of the three pads PB1 to PB3, the output signal φ56 of the Hi-z detection circuit 56 turns to an "H" level. In this case, the signals φ57 and φ58 respectively turn to an "H" level and an "L" level, the signals φ61 and φ62 turn to "L" levels to reset the internal circuit 63, and operation of the internal circuit 63 is stopped.

In this second embodiment, in a case where the bonding of the pad PB has failed, erroneous operation of the internal circuit 63 can be prevented.

Figure 11:
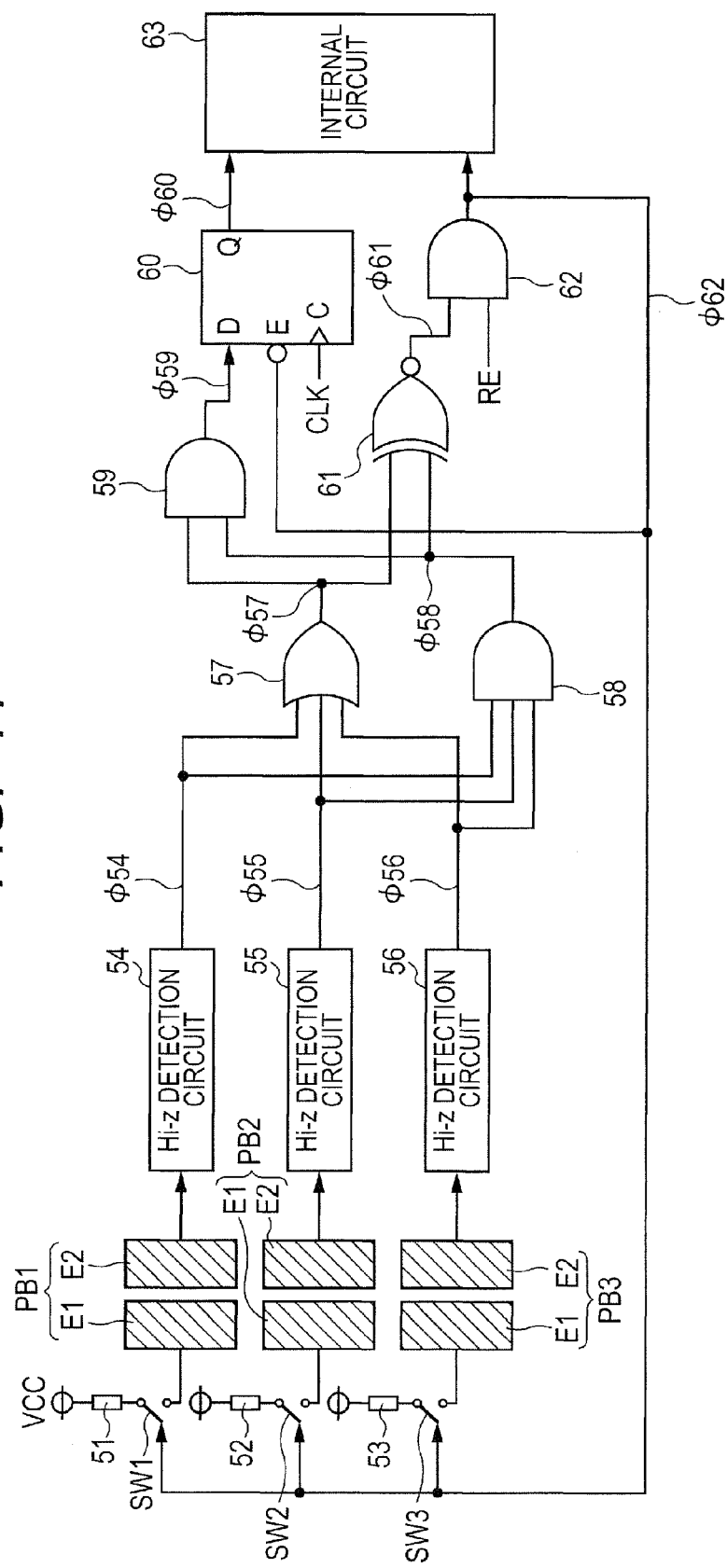
FIG. 11 is a circuit block diagram showing a modified example of the second embodiment.

FIG. 11 is a circuit block diagram, in comparison to FIG. 9, showing a modified example of the second embodiment. Referring to FIG. 11, this semiconductor chip differs from the semiconductor chip of FIG. 9 in that switches SW1 to SW3 are added.

One-side terminals of the switches SW1 to SW3 are respectively coupled to the other side terminals of the resistive elements 51 to 53, and the other side terminals of the switches SW1 to SW3 are respectively coupled to the electrodes E1 of the pads PB1 to PB3. The switches SW1 to SW3 turns on in a case where the output signal φ62 of the AND gate 62 is at an "L" level, and turns off in a case where the output signal φ62 of the AND gate 62 is at an "H" level.

Determination on whether the semiconductor chip is mounted over the package 3 with the 80 terminals or the package 5 with the 100 terminals is performed upon reset operation. Upon the reset operation, the reset signal RE is turned to an "L" level that is an active level and the output signal φ62 of the AND gate 62 turns to an "L" level. As a result, the switches SW1 to SW3 turn on and the supply voltage VCC is applied to the electrodes E1 of the pads PB1 to PB3. Moreover, the register 60 is activated, and the internal circuit 63 is reset and deactivated. It is detected by the Hi-z detection circuits 54 to 56 whether or not the electrodes E2 of the pads PB1 to PB3 are in the Hi-z state, the signal φ59 as a detection result is held in the register 60, and the output signal φ60 of the register 60 is given to the internal circuit 63.

In a case where the bonding is properly performed and the output signal φ61 of the Ex-NOR gate 61 is at an "H" level, the reset operation ends and the reset signal RE is turned to an "H" level that is an inactive level, upon which the output signal φ62 of the AND gate 62 turns to an "H" level. When the signal φ62 has turned to the "H" level, the switches SW1 to SW3 are turned off and voltage application to the pads PB1 to PB3 is stopped. As a result, leak current flowing from the line of the supply voltage VCC via the resistive elements 51 and 52 and the pads PB1 to PB3 can be reduced, permitting reduction in consumed current of the semiconductor chip. Moreover, the register 60 is deactivated to fix a logical level of the output signal φ60 of the register 60, and resetting of the internal circuit 63 is released.

Note that in a case where the output signal φ61 of the Ex-NOR gate 61 has turned to an "L" level as a result of improper bonding performance, even when the reset operation ends to turn the reset signal RE to an "H" level that is an inactive level, the output signal φ62 of the AND gate 62 turns to an "L" level. In this case, the switches SW1 to SW3 are turned on and a reset state of the internal circuit 63 is maintained.

The embodiments disclosed herein should be considered to be illustrate in all points and not limitative. The scope of the invention is indicated not by the above description but by the scope of claims, and all modifications within spirits and a range equivalent to the scope of claims are included.

What is claimed is:

1. A semiconductor chip mountable over a desired one of a first package having N-number (N is a natural number) of first terminals and a second package having M-number (M is an integer larger than N) of second terminals, the semiconductor chip comprising N-number of first pads and (M−N)-number of second pads, wherein, in a case where the semiconductor chip is mounted over the first package, the N-number of first pads are respectively coupled to the N-number of first terminals via N-number of bonding wires, and in a case where the semiconductor chip is mounted over the second package, the N-number of first pads and the (M−N)-number of second pads are respectively coupled to the M-number of second terminals via M-number of bonding wires, wherein a selected second pad of the (M−N)-number of second pads is divided into first and second electrodes insulated from each other, and wherein the first and second electrodes are arranged at a predetermined interval therebetween, and when a corresponding second pad is coupled to the corresponding second terminal via the bonding wire, short by an end part of the bonding wire occurs, the semiconductor chip further comprising an internal circuit operating as a first semiconductor device having the N-number of first terminals in a case where the first and second electrodes are insulated from each other and operating as a second semiconductor device having the M-number of second terminals in a case where the first and second electrodes are shorted therebetween.

2. The semiconductor chip according to claim 1, further comprising a detection circuit detecting whether the first and second electrodes are insulated from each other or shorted therebetween and then outputting a signal indicating a result of the detection,
    wherein the internal circuit operates based on the signal outputted by the detection circuit.

3. The semiconductor chip according to claim 2, further comprising a resistive element with one electrode receiving reference voltage and another electrode coupled to the first electrode,
    wherein, in a case where the reference voltage is not applied to the second electrode, the detection circuit outputs a signal at a first logical level indicating that the first and second electrodes are insulated from each other, and in a case where the reference voltage is applied to the second electrode, the detection circuit outputs a signal at a second logical level indicating that the first and second electrodes are shorted therebetween, and
    wherein the internal circuit operates as the first semiconductor device in response to the signal at the first logical level and operates as the second semiconductor device in response to the signal at the second logical level.

4. The semiconductor chip according to claim 3, further comprising a switch serially coupled to the resistive element between a line of the reference voltage and the first electrode, the switch being turned on at time of detection operation by which it is detected whether or not the reference voltage is applied to the second electrode, the switch being turned off at time of normal operation of the internal circuit.

5. The semiconductor chip according to claim 2,
    wherein a plurality of second pads of the (M−N)-number of second pads are selected,
    wherein each of the selected second pads is divided into the first and second electrodes,
    wherein a plurality of the detection circuits are provided respectively in correspondence with the selected second pads, and
    wherein the internal circuit operates based on results of detection by the detection circuits in a case where the results of the detection by the detection circuits agree with each other and does not operate in a case where the results of the detection by the detection circuits do not agree with each other.

\* \* \* \* \*